United States Patent [19]

Yamaguchi

[11] Patent Number: 5,902,718

[45] Date of Patent: May 11, 1999

[54] METHODS AND DEVELOPER FOR DEVELOPING A POSITIVE PHOTORESIST

[75] Inventor: Atsumi Yamaguchi, Hyogo-ken, Japan

[73] Assignee: Mitsubishi Denki Kabushiki Kaisha, Tokyo, Japan

[21] Appl. No.: 07/891,123

[22] Filed: Jun. 1, 1992

Related U.S. Application Data

[63] Continuation-in-part of application No. 07/607,004, Oct. 31, 1990, abandoned.

[30] Foreign Application Priority Data

Apr. 27, 1990 [JP] Japan ..................................... 2-113632

[51] Int. Cl.⁶ ........................................................ G03F 7/32
[52] U.S. Cl. ............................................................... 430/331
[58] Field of Search ............................................... 430/331

[56] References Cited

U.S. PATENT DOCUMENTS

| | | | |
|---|---|---|---|
| 3,607,271 | 9/1971 | Hilhorst et al. | 430/331 |
| 4,423,138 | 12/1983 | Guild | 430/331 |
| 4,873,177 | 10/1989 | Tanaka et al. | 430/331 |
| 4,914,006 | 4/1990 | Kato et al. | 430/331 |

*Primary Examiner*—Christopher G. Young
*Attorney, Agent, or Firm*—McDermott, Will & Emery

[57] ABSTRACT

Methods for developing a positive photoresist comprise providing a positive photoresist and developing the positive photoresist with a developer comprising a quaternary ammonium hydroxide and a quaternary ammonium halogenide. The positive photoresist has an unexposed portion dissolution rate with a 2.38 weight % aqueous solution of tetramethyl ammonium hydroxide of about 1 Å/sec or less. The quaternary ammonium halogenide is of the formula

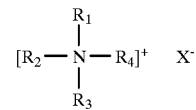

wherein $R_1$, $R_2$, $R_3$, $R_4$ are selected from the group consisting of ethyl, methyl, hydroxy methyl, hydroxy ethyl and hydrogen, and X is a halogen atom.

9 Claims, 5 Drawing Sheets

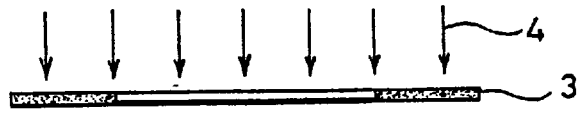
FIG.4A
(Prior Art)
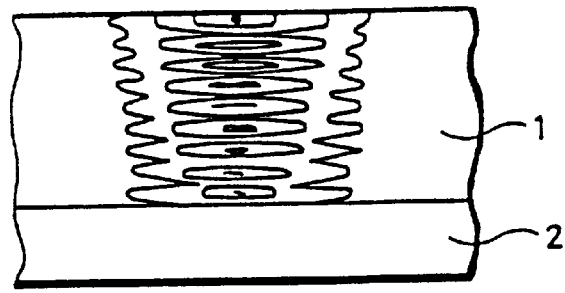
FIG.4B
(Prior Art)
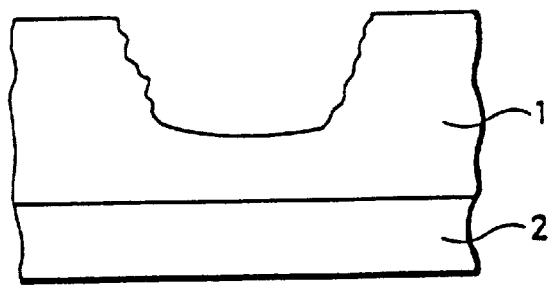
FIG.4C
(Prior Art)
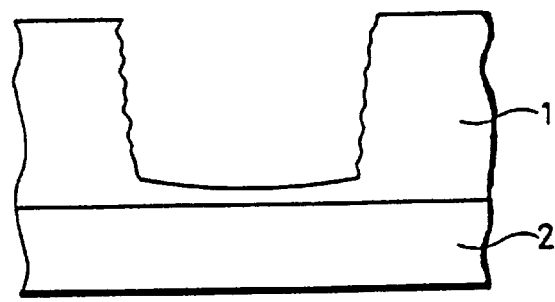
FIG.4D
(Prior Art)
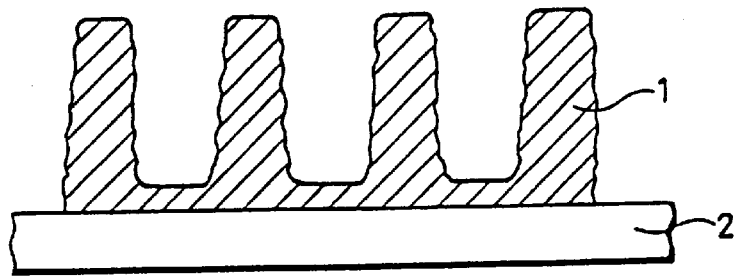

METHODS AND DEVELOPER FOR DEVELOPING A POSITIVE PHOTORESIST

RELATED APPLICATION

The present application is a continuation-in-part of application Ser. No. 07/607,004 filed Oct. 31, 1990, now abandoned.

FIELD OF THE INVENTION

The present invention relates generally to methods for developing positive photoresists and, more particularly, to methods for developing a positive photoresist which provide a superior selectivity in dissolution between exposed portions and unexposed portions. The methods preferably employ a quinone di-azido type positive photoresist having an unexposed portion dissolution rate of about 1 Å/sec or less.

BACKGROUND OF THE INVENTION

Conventionally, a base substrate is subjected to a selective process by, e.g., etching or diffusion in the manufacture of a semiconductor integrated circuit element, a mask for manufacture of an integrated circuit, a printed wiring board, a printed board and the like. In this case, a composition which is sensitive to active rays of light such as ultraviolet rays, X-rays or electron rays, is used to form a so-called photoresist film on the base substrate in order to selectively protect non-process portions of the substrate. Light is then selectively directed onto the photoresist film employing a mask, and thereafter photoresist patterns are formed on the substrate by developing the photoresist film.

There are two types of the photoresist, namely positive type and negative type. The positive photoresist is of such a type that the exposed portion dissolves in a developer, while the unexposed portion does not dissolve therein, and the negative photoresist is of the opposite type. A representative of the positive photoresist is a composition of an alkali-soluble novolak resin being a base and a naphthoquinone di-azido compound being an agent for photodecomposition. For this quinone di-azido-type positive photoresist, a water solution of tetramethyl ammonium hydroxide of 2.38% by wt (weight) is generally employed as a developer.

FIGS. 2A–2E are cross-sectional views showing conventional processing steps of forming a photoresist pattern.

Referring to FIGS. 2A and 2B, a uniform thin film of a photoresist 1 is first formed on a substrate 2 by dropping a solution of the positive photoresist on substrate 2 and then spinning substrate 2. For the positive photoresist are employed MCPR2000H (manufactured by Mitsubishi Kasei Co., Ltd.) MCPR3000E (manufactured by Mitsubishi Kasei Co., Ltd.) and TSMRV5 (manufactured by Tokyo Ohka Co., Ltd.). These positive photoresists generally have an unexposed portion dissolution rate with a 2.38% aqueous solution of tetramethyl ammonium hydroxide of about 1 Å/sec or less. For example, MCPR2000H has an unexposed portion dissolution rate of 0.16 Å/sec, MCPR3000E has an unexposed portion dissolution rate of 0.10 Å/sec and TSMRV5 has an unexposed portion dissolution rate of 0.10 Å/sec. The dissolution rate of the unexposed portion of these resists with respect to the developing solution is significantly lower than that of conventional resists. The difference in dissolution rates for the developing solution between the exposed portions and the unexposed portions of the resists is increased in order to achieve a higher resolving power.

Referring to FIG. 2C, ultra-violet rays 4 are then selectively directed onto thin photoresist film 1 through a photomask 3 on which an electronic circuit is drawn.

The substrate 2 is then placed on a hot plate and heated at 100–120° C., as shown in FIG. 2D. This heating process to be carried out after exposure and before development is called a PEB (Post Exposure Bake) process. This step is not indispensable but may be carried out if necessary.

Referring now to FIG. 2E, development of the resultant film with the water solution of tetramethyl ammonium hydroxide of 2.38% by wt causes dissolution of the portion irradiated with light, thereby forming a pattern of photoresist 1.

Next, a photosensitive mechanism of the positive photoresist is shown in FIG. 3. Naphthoquinone di-azido [I] residing in the photoresist absorbs ultraviolet rays, then transforms to carbene [II] and then to ketene [III]. This ketene [III] reacts with water existing in the system and then transforms to indene carboxylic acid [IV]. This indene carboxylic acid [IV] dissolves in an alkali solution of the developer, whereby the exposed portion of the photoresist 1 is removed, as shown in FIG. 2E.

A super LSI is currently manufactured according to a design rule of 1 $\mu$m or less by employing the above-described positive photoresist materials.

The foregoing conventional method, however, causes the following disadvantages, as a degree of integration of super LSI becomes further enhanced, as described with reference to FIGS. 4A–4D.

A principle of the formation of a positive photoresist pattern is briefly the utilization of a difference in dissolution rates between the exposed portion and the unexposed portion of the photoresist.

Referring to FIG. 4A, ultraviolet rays 4 directed to the photoresist 1 produce interferences with light reflected from the substrate 2 in the film of the photoresist 1 and, consequently a standing wave occurs. Thus, the degree of decomposition of a photosensitive agent in the film of the photoresist 1 is uneven, thereby producing distributions as shown in the figure. Accordingly, development causes formation of a pattern in accordance with the distribution in degree of the decomposition of the photosensitive agent, as shown in FIG. 4B.

When the width of the pattern is extremely narrow (approximately 0.5 $\mu$m), photoresist in the vicinity of the substrate 2 is not developed even by a further advanced development, and thus the photoresist 1 is not completely removed, with reference to FIG. 4C. Consequently, a resist pattern having a poor resolving power is obtained, as shown in FIG. 4D.

In order to solve these disadvantages, Japanese Patent Laying-Open No. 61-232454 discloses a technique in which a trialkyl methyl ammonium compound having an alkyl group containing 3 to 5 carbons is added to a developer. According to this conventional technique, the addition of the above-described quaternary ammonium compound to the developer enables a considerable degradation in the solubility of the exposed portion. This enhances the selectivity in dissolution between the exposed portion and the unexposed portion and also enhances the resolution.

This method, however, still has problems in causing a degradation in the solubility of the exposed portion as well as the unexposed portion, and consequently, a degradation in total sensitivity results.

SUMMARY OF THE INVENTION

An object of the present invention is therefore to provide a method for developing a positive photoresist which provides an enhancement in resolution.

Another object of the present invention is to provide a method for developing a positive photoresist which provides a reduction in the amount of a resist residue remaining on a substrate.

A further object of the present invention is to provide a method for developing a positive photoresist which provides an enhancement in resolution without a decrease in sensitivity.

A still further object of the present invention is to provide a method for developing a positive photoresist which provides an enhancement in selectivity of the dissolution between an exposed portion and an unexposed portion by considerably increasing the development speed of the exposed portion.

A method for developing a positive photoresist according to the present invention employs a developer composition containing a quaternary ammonium hydroxide and a quaternary ammonium halogenide represented by a general formula

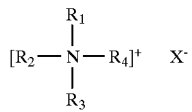

wherein $R_1$, $R_2$, $R_3$, $R_4$ denote alkyl groups or hydroxyalkyl groups having two carbons or less or hydrogen, and X denotes a halogen atom.

The developer composition for a positive photoresist employed in the methods of the present invention has a quaternary ammonium halogenide content of preferably 0.01–0.20 mol/l and more preferably 0.08–0.12 mol/l.

The preferable content of quaternary ammonium hydroxide is 1.5–2.7% by wt.

The method for developing a positive photoresist according to the present invention further employs a positive photoresist having an unexposed portion dissolution rate with a 2.38 weight percent aqueous solution of tetramethyl ammonium hydroxide of about 1 Å/sec or less. As noted above, such positive photoresists are advantageous in that they exhibit good resolution. Moreover, the developer composition employed in the present methods overcomes the disadvantages of prior art use of such positive photoresists by increasing the dissolution rate of the exposed portions thereof, thereby improving the selectivity in dissolution between the unexposed portion and the exposed portion of the photoresist.

In the methods for developing a positive photoresist according to the present invention, the quaternary ammonium halogenide containing the alkyl group or hydroxyalkyl group having two carbons or less or hydrogen is employed. The substituents of this quaternary ammonium halogenide are smaller in size than that of a quaternary ammonium halogenide disclosed in Japanese Patent Laying-Open No. 61-232454. Because of the small substituents, this quaternary ammonium halogenide can easily enter in the resist film in development. Further, the dissolution rate of the resist remarkably increases at the exposed portions of the resist. Consequently, the selectivity in dissolution for the exposed portions is enhanced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A–4D are conceptional views showing the result of formation of a resist pattern employing a conventional method and developer for a positive photoresist.

Figure 5:
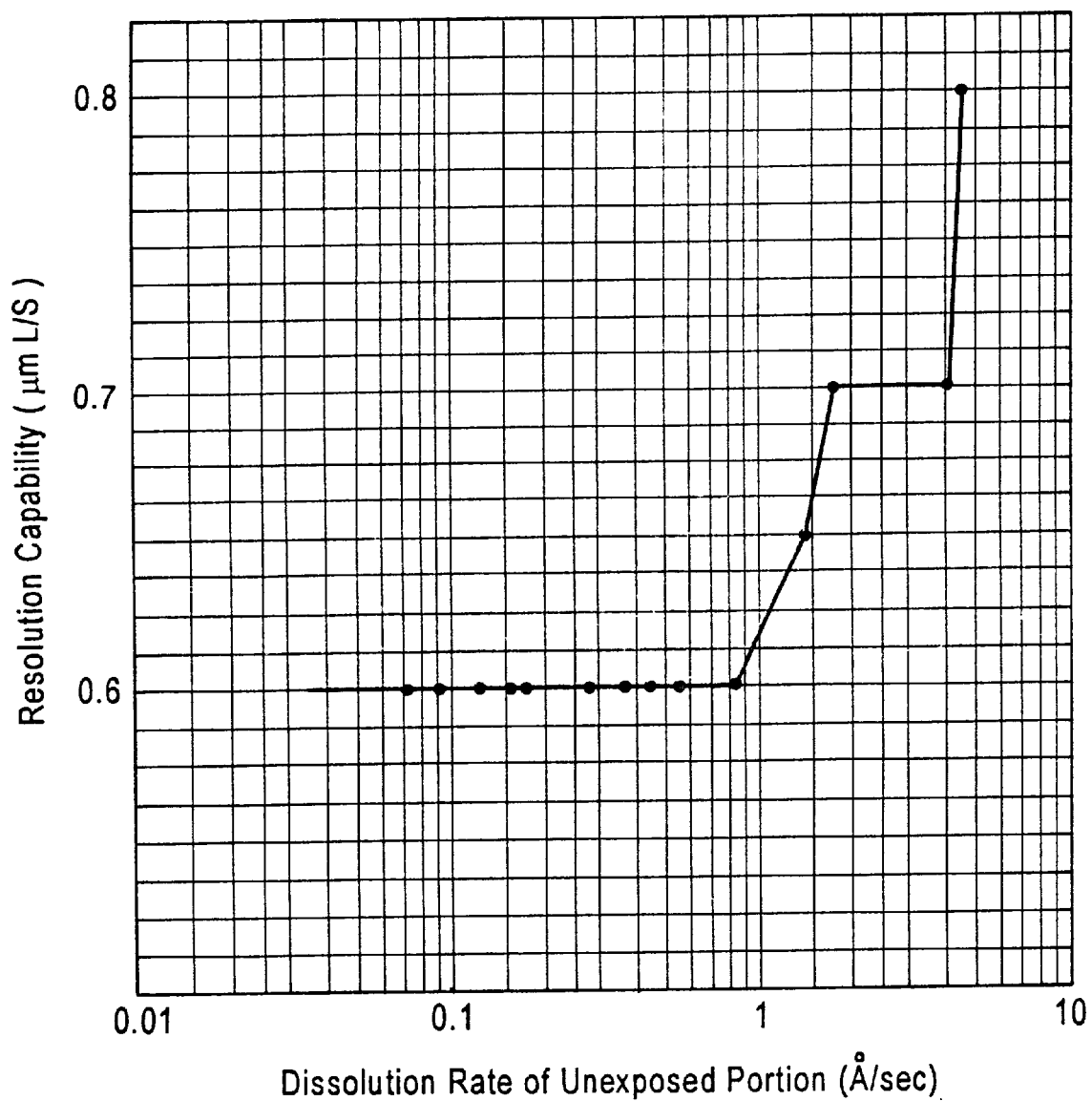
FIG. 5 is a graph showing the relationship between the dissolution rate of an unexposed portion and the resolution for various positive photoresist materials.

The methods for developing a positive photoresist according to the present invention comprise providing a positive photoresist, and developing the positive photoresist with a developer composition comprising a quaternary ammonium hydroxide and a quaternary ammonium halogenide. The positive photoresist has an unexposed portion dissolution rate with a 2.38 weight % aqueous solution of tetramethyl ammonium hydroxide of about 1 Å/sec or less. The use of such a positive photoresist is advantageous in that such positive photoresist exhibit good resolution. For example, FIG. 5 sets forth the resolution capability ($\mu$m L/S) as a function of the dissolution rate of the unexposed portion (Å/sec) for various positive photoresists materials. As is apparent from FIG. 5, the resolution improves considerably when the dissolution rate of the unexposed portion is 1 Å/sec or less. The particular resist materials which were used in preparing FIG. 5 were as follows:

| Resists | Dissolution rate of unexposed portion, Å/sec | Resolution $\mu$m L/S |
| --- | --- | --- |
| 1 | 0.074 | 0.60 |
| 2 | 0.093 | 0.60 |
| 3 | 0.125 | 0.60 |
| 4 | 0.160 | 0.60 |
| 5 | 0.175 | 0.60 |
| 6 | 0.283 | 0.60 |
| 7 | 0.370 | 0.60 |
| 8 | 0.443 | 0.60 |
| 9 | 0.549 | 0.60 |
| 10 | 0.84 | 0.60 |
| 11 | 1.44 | 0.65 |
| 12 | 1.75 | 0.70 |
| 13 | 4.14 | 0.70 |
| 14 | 4.49 | 0.80 |

The detail of resists 1–14 used is as follows:
Resist 1: TT09 (a trial product manufactured by Nippon Gosei Gum)
Resist 2: TH02 (a trial product manufactured by Nippon Gosei Gum)
Resist 3: trial product G4
Resist 4: MCPR 2000H (manufactured by Mitsubishi Kasei)
Resist 5: trial product G3
Resist 6: trial product G5
Resist 7: trial product I2
Resist 8: RI-7179P (manufactured by Hitachi Kasei Kogyo)
Resist 9: trial product G6
Resist 10: trial product G2
Resist 11: trial product I3
Resist 12: tiral product I1
Resist 13: trial product I4
Resist 14: trial product G1

As noted above, the substituents $R_1$, $R_2$, $R_3$ and $R_4$ of the quaternary ammonium halogenide are selected from the group consisting of ethyl, methyl, hydroxyethyl, hydroxymethyl and hydrogen. The quaternary ammonium hydroxide is included in the developer in an amount sufficient to dissolve exposed portions of the photoresist and the quaternary ammonium halogenide is included in an amount sufficient to improve the selectivity in dissolution between an exposed portion and an unexposed portion of the photoresist by the quaternary ammonium hydroxide.

Examples of the present invention will now be described.

EXAMPLE 1

Tetramethyl ammonium chloride, hereinafter abbreviated as TMACl, (15.8 g) is dissolved in a 2.38% by wt aqueous solution of tetramethyl ammonium hydroxide of 1 l to prepare a developer. The molar concentration of this TMACl is 0.10 mol/l. FIGS. 1A–1D show the results of formation of a resist pattern by employing the above-described developer. For a photoresist, MCPR2000H (a positive photoresist manufactured by Mitsubishi Kasei Co., Ltd. having an unexposed portion dissolution rate of 0.16 Å/sec) is employed.

Figure 1A:
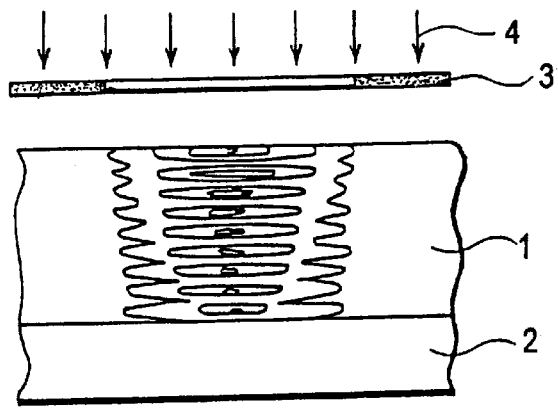
FIGS. 1A–1D are conceptional views showing the results of formation of a resist pattern using a positive photoresist according to one embodiment of the present invention.

Referring to FIG. 1A, direction of ultraviolet rays 4 onto a photoresist 1 produces a standing wave in photoresist 1, as already explained in the description of FIG. 4A. Consequently, the degree of decomposition of a photosensitive agent is not uniform and thus creates distributions as shown in the figure.

Figure 1B:
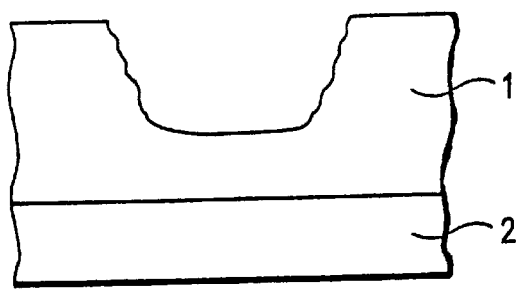
Figure 1C:
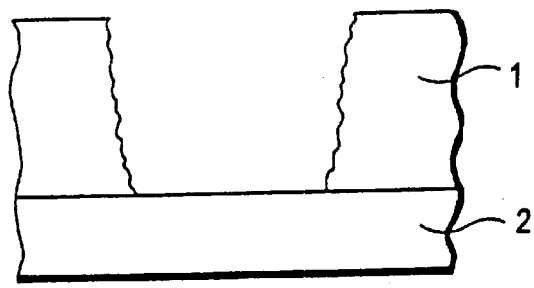
Figure 1D:
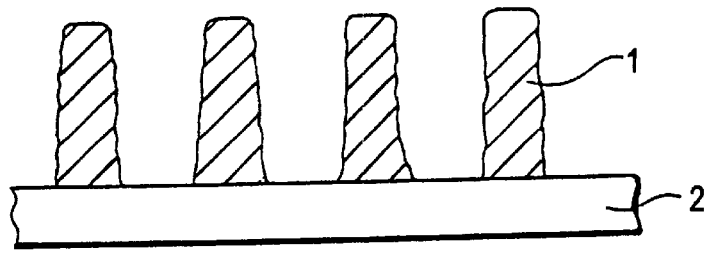
Figure 2A:
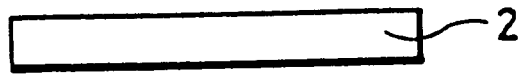
FIGS. 2A–2E are cross-sectional views showing conventional processing steps in a method of forming a resist pattern.
Figure 2B:
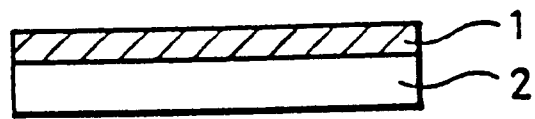
Figure 2C:
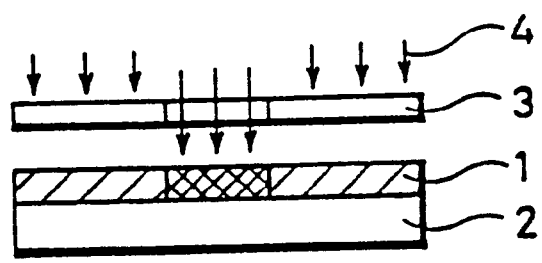
Figure 2D:
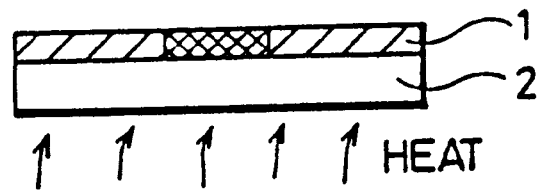
Figure 2E:
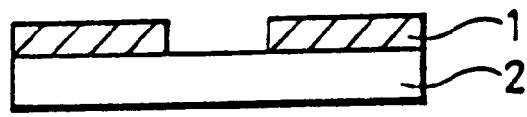
Figure 3:
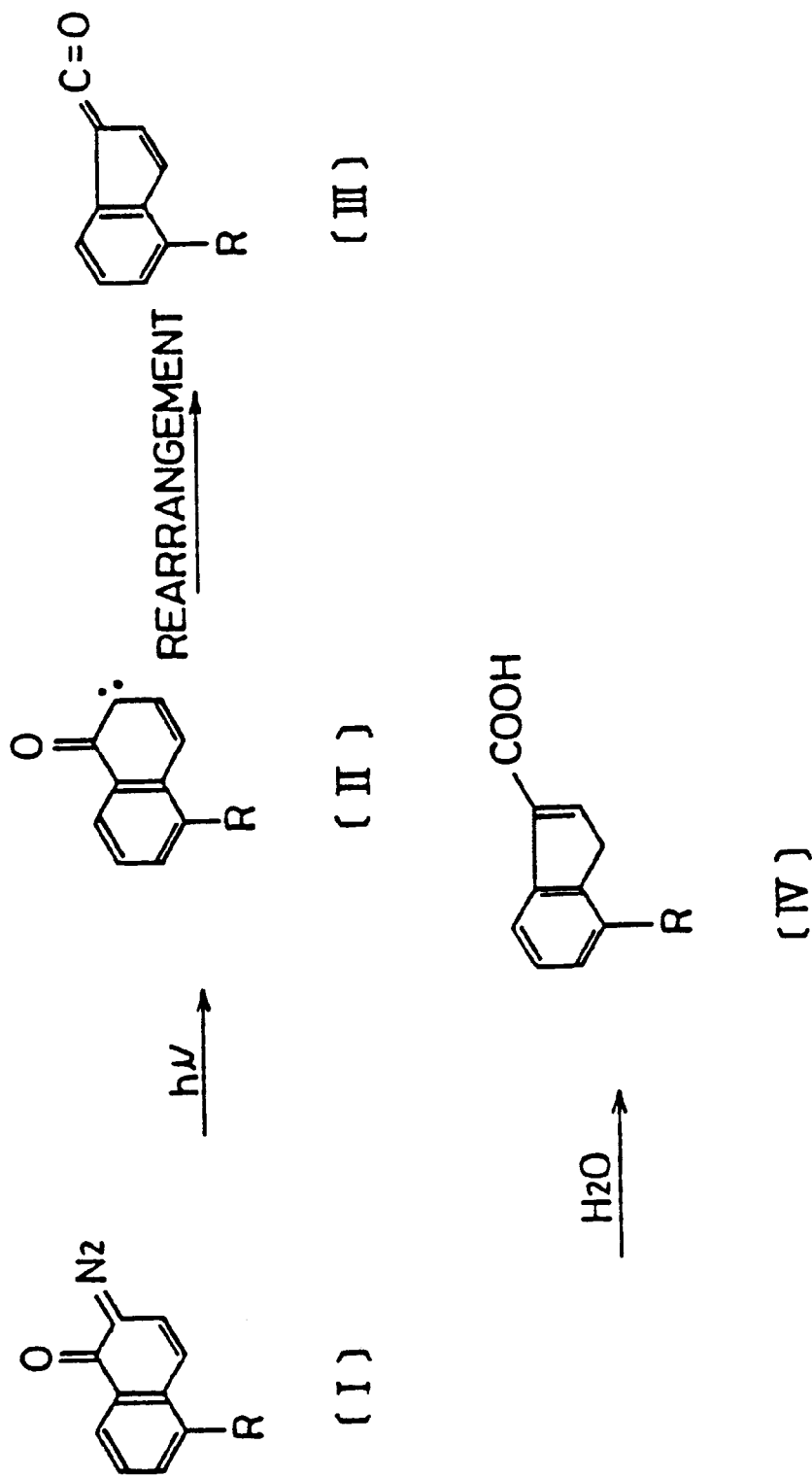
FIG. 3 is a diagram showing a photosensitive mechanism.

In this embodiment, however, even if the distributions occur in the degree of decomposition of the photosensitive agent, the development advances to such an extent that the surface of the substrate 2 becomes exposed by employing the above-described developer, with reference to FIG. 1B (showing a step in the course of development) and FIG. 1C. Consequently, a resist pattern having a superior resolving power is obtained, as shown in FIG. 1D. The resolution increases to 0.45 μm L/S. When a conventional developer to which no above-described tetramethyl ammonium chloride is added is employed for the development, a critical resolution is 0.5 μm L/S.

Moreover, even in the formation of a 0.5 μm L/S pattern, a resist residue is left on the substrate when employing the conventional developer; however, no residue of resist is left in the method of the invention.

EXAMPLES 2–6 AND COMPARATIVE EXAMPLE

The following Examples and Comparative Example are carried out under the same condition as the Example 1 except for a variation in species and concentrations of additives.

In Example 2, development is carried out by employing a developer made by dissolving tetramethyl ammonium bromide (TMABr) into a 2.38% by wt aqueous solution of tetramethyl ammonium hydroxide to attain a concentration of 0.10 mol/l. In Example 3, development is carried out by employing a developer made by dissolving tetramethyl ammonium iodide (TMAI) into the 2.38% by wt aqueous solution of tetramethyl ammonium hydroxide to attain a concentration of 0.10 mol/l. In Example 4, development is carried out by employing a developer made by dissolving tetramethyl ammonium chloride into the 2.38% by wt aqueous solution of tetramethyl ammonium hydroxide to attain a concentration of 0.05 mol/l. In Example 5, development is carried out by employing a developer made by dissolving tetramethyl ammonium bromide into the 2.38% by wt aqueous solution of tetramethyl ammonium hydroxide to attain a concentration of 0.05 mol/l. In Example 6, development is carried out by employing a developer made by dissolving tetramethyl ammonium iodide into the 2.38% by wt aqueous solution of tetramethyl ammonium hydroxide to attain a concentration of 0.05 mol/l. In the Comparative Example, development is carried out by employing a developer merely containing the 2.38% by wt aqueous solution of tetramethyl ammonium hydroxide. The results of those embodiments and the example are shown in Table 1.

TABLE 1

| | Developer | Sensitivity (Optimal exposure time) msec | Reduction in thickness of film (Development time 50 sec.) Å | Dissolution rate of unexposed portion Å/sec | Dissolution rate when photosensitive agent is decomposed by 10% Å/sec | Dissolution rate when photosensitive agent is decomposed by 20% Å/sec | Dissolution rate for each optimal exposure time Å/sec |
|---|---|---|---|---|---|---|---|
| Embodiment 1 | TMACl (0.10) | 330 | 12 | 0.23 | 1.5 | 8.5 | 1250 |
| Embodiment 2 | TMABr (0.10) | 320 | 16 | 0.32 | 3.0 | 13.0 | 1200 |
| Embodiment 3 | TMAI (0.10) | 300 | 21 | 0.42 | 3.5 | 23.0 | 1250 |
| Embodiment 4 | TMACl (0.05) | 335 | 10 | 0.21 | 0.85 | 3.8 | 1200 |
| Embodiment 5 | TMABr (0.05) | 330 | 11 | 0.23 | 1.3 | 8.5 | 1200 |
| Embodiment 6 | TMAI (0.05) | 320 | 17 | 0.34 | 1.6 | 10.0 | 1250 |
| Example for comparison | No addition | 340 | 7.9 | 0.16 | 0.5 | 3.0 | 1250 |

Table 1 demonstrates the following:

(1) In regard to the dissolution rate when a photosensitive agent is decomposed by 20%, the obtained values in Examples 1–6 are all markedly higher than the value in the Comparative Example. It appears, referring to FIG. 1B, that the photosensitive agent is decomposed only approximately 20% at the bottom portion of photoresist 1. Accordingly, it is presumed that in the case of the Comparative Example, resist 1 cannot be removed completely because of the lower dissolution rate (3.0 Å/sec). On the other hand, it is presumed that in the case of Example 1, the resist can be completely removed so as to expose the substrate because of the higher dissolution rate of 8.5 Å/sec.

(2) With comparisons among Examples 1, 2 and 3, the dissolution rates in these embodiments when the photosensitive agent is decomposed by 20% become increased in the order of I>Br>Cl.

(3) As apparently revealed from a comparison between the dissolution rates when the photosensitive agent is decomposed by 20% and the dissolution rates of unexposed portion, the addition of the quaternary ammonium halogenide considerably increases the dissolution rates of the resist at the exposed portion compared to those of the unexposed portion. This demonstrates that the selectivity in dissolution between the exposed portion and the unexposed portion is enhanced. The enhancement in selectivity of dissolution indicates the enhancement in resolution.

(4) It is found by a comparison of Examples 1–6 with the Comparative Example that the sensitivity is increased (i.e., the optimal exposure time is decreased) by the addition of the quaternary ammonium halogenide. It is presumed that since the quaternary ammonium halogenide employed in the Examples has a small substituent, it can easily enter in the resist film, thereby increasing the dissolution rate.

The foregoing description has been made as to the effects of the present invention with the quaternary ammonium halogenide shown specifically by way of example. The sensitivity is found to be similarly increased in methods employing quaternary ammonium halogenides of the general formula

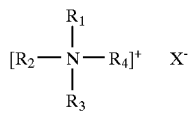

wherein $R_1$, $R_2$, $R_3$, $R_4$ denote alkyl groups or hydroxyalkyl groups having two carbons or less or hydrogen. As examples of the groups having two carbons or less, there are provided an ethyl group, a hydroxymethyl group, a hydroxyethyl group and the like other than a methyl group.

EXAMPLE 7

This example further demonstrates the improvements provided by the present methods. More particularly, resists materials 1–6 as follows were used to form positive photoresists.

Resist 1: MCPR 2000H (manufactured by Mitsubishi Kasei)
Resist 2: trial product G1
Resist 3: trial product G2
Resist 4: trial product G3
Resist 5: trial product I1
Resist 6: OFPR 800 (manufactured by Tokyo Ohka Kogyo)

Table II sets forth the dissolution rate of unexposed portions of each of resists materials 1–6 when no quaternary ammonium halogenide is employed in the tetramethyl ammonium hydroxide developer, and when 0.10 mol/l tetramethyl ammonium iodide is employed in the developer, respectively. As is evident from Table II, resists 1, 3 and 4 are of the type employed in the present methods wherein the unexposed portions of these resists have dissolution rates with a 2.38 weight % aqueous solution of tetramethyl ammonium hydroxide of less than about 1 Å/sec. On the other hand, resist materials 2, 5 and 6 are not of the type employed in the present methods and have unexposed portion dissolution rates greater than about 1 Å/sec. Accordingly, resists materials 1, 3 and 4 exhibit good resolution (0.60 μm L/S), while resist materials 2, 5 and 6 exhibit inferior resolution, whereby the shape of the developed resist formed from materials 2, 5 and 6 is poor.

With further reference to resist materials 1, 3 and 4 described in Table II, the addition of tetramethyl ammonium iodide causes an increase in the dissolution rate in the exposed portions where the decomposition degree of the photosensitive agent is relatively low as shown in FIGS. 1A–1B. This enables a reduction in the resist residue, and therefore an increase in resolution, thereby further demonstrating the advantages of the present methods.

TABLE II

| Resist | TMAI concentration (mol/l) | Dissolution rate of unexposed portion (0%) (Å/sec) | Dissolution rate when photosensitive agent is decomposed by 10% (Å/sec) | Dissolution rate when photosensitive agent is decomposed by 20% (Å/sec) | Dissolution rate for each optimal exposure time (Å/sec) | Resolution (μm L/S) |
|---|---|---|---|---|---|---|
| 1 | 0 | 0.16 | 0.5 | 3.0 | 1250 | 0.60 |
|   | 0.10 | 0.42 | 3.5 | 23 | 1250 |  |
| 2 | 0 | 4.5 | 66 | 290 | 1300 | 0.80 |
|   | 0.10 | 22 | 190 | 750 | 1500 |  |
| 3 | 0 | 0.84 | 3.5 | 23 | 1250 | 0.60 |
|   | 0.10 | 3.3 | 20.7 | 137 | 1400 |  |
| 4 | 0 | 0.16 | 0.25 | 0.80 | 1250 | 0.60 |
|   | 0.10 | 0.50 | 1.57 | 8.57 | 1050 |  |
| 5 | 0 | 1.75 | 13 | 29 | 950 | 0.70 |
|   | 0.10 | 7.0 | 61 | 133 | 1050 |  |
| 6 | 0 | 20 | 35 | 62 | 640 | 0.80 |
|   | 0.10 | — | — | — | — |  |

While such cases have been shown as examples that the content of the quaternary ammonium halogenide is 0.10 mol/l and 0.05 mol/l in the above-described embodiments, a satisfactory result is obtained in the range of 0.01–0.20 mol/l. The most satisfactory result is obtained particularly in the range of 0.080–0.12 mol/l.

In addition, while the developer containing the 2.38% by wt aqueous solution of tetramethyl ammonium hydroxide has been shown by way of example in the above-described embodiments, a satisfactory result is acquired with the tetramethyl ammonium hydroxide content being in the range of 1.5–2.7% by wt.

As has been explained heretofore, the quaternary ammonium halogenide having the alkyl group or hydroxyalkyl group containing two carbons or less or hydrogen is added in the developer composition for a positive photoresist according to the present invention. Since the quaternary ammonium halogenide has a small substituent, it can easily enter in the resist film in development. This leads to the significant increase in dissolution rate of the exposed portion of the resist, resulting in the enhancement in selectivity of dissolution for the exposed portion and unexposed portion and the enhancement in resolution. The employment of the developer according to the present invention makes it possible to reduce the amount of resist residue left on the substrate.

Although the present invention has been described and illustrated in detail, it is clearly understood that the same is by way of illustration and example, only and is not to be taken by way of limitation, the spirit and scope of the present invention being limited only by the terms of the appended claims.

What is claimed is:

1. A method for developing a positive photoresist, comprising providing a positive photoresist having an unexposed portion dissolution rate with a 2.38 wt % aqueous solution of tetramethyl ammonium hydroxide of about 1 Å/sec or less, image-wise exposing the positive photoresist to an activating radiation to form a latent image, and removing the exposed portions of the positive photoresist with a developer comprising a quaternary ammonium hydroxide and a quaternary ammonium halogenide of the formula

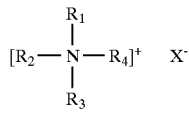

wherein $R_1$, $R_2$, $R_3$ and $R_4$ are selected from the group consisting of ethyl, methyl, hydroxymethyl, hydroxyethyl and hydrogen, and X is a halogen atom, the quaternary ammonium hydroxide being included in an amount sufficient to dissolve an exposed portion of the photoresist and the quaternary ammonium halogenide being included in an amount sufficient to improve the selectivity in dissolution between an exposed portion and an unexposed portion of the photoresist by the quaternary ammonium hydroxide.

2. The method according to claim 1, wherein said quaternary ammonium halogenide comprises a tetramethyl ammonium halogenide.

3. The method according to claim 1, wherein X is chlorine.

4. The method according to claim 1, wherein the developer comprises 0.01–0.20 mol/l of said quaternary ammonium halogenide.

5. The method according to claim 4, wherein the developer comprises 0.08–0.12 mol/l of said quaternary ammonium halogenide.

6. The method according to claim 1, wherein said quaternary ammonium hydroxide comprises tetramethyl ammonium hydroxide.

7. The method according to claim 1, wherein the developer comprises 1.5–2.7% by weight of said quaternary ammonium hydroxide.

8. The method according to claim 7, wherein the developer comprises 2.38% by weight of said quaternary ammonium hydroxide.

9. The method according to claim 1, wherein the positive photoresist has an unexposed portion dissolution rate with a 2.38% aqueous solution of tetramethyl ammonium hydroxide of 0.16 Å/sec or less.

* * * * *